(12) United States Patent
Lee et al.

(10) Patent No.: US 6,721,549 B2
(45) Date of Patent: Apr. 13, 2004

(54) LOW-NOISE AMPLIFIER FOR A MOBILE COMMUNICATION TERMINAL

(75) Inventors: Woo-Yong Lee, Songnam-shi (KR); Seung-Ki Cho, Seoul (KR); Se-Young Park, Seoul (KR); Jae-Min Lee, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 431 days.

(21) Appl. No.: 09/752,708

(22) Filed: Dec. 28, 2000

(65) Prior Publication Data

US 2001/0029172 A1 Oct. 11, 2001

(30) Foreign Application Priority Data

Dec. 29, 1999 (KR) .............................................. 99-65239

(51) Int. Cl.[7] ................................................ H04B 1/06
(52) U.S. Cl. ................................ 455/234.1; 455/232.1; 455/251.1; 455/127.2; 330/127; 330/296; 330/278; 330/285
(58) Field of Search .......................... 455/239.1, 233.1, 455/232.1, 127.1, 27.2, 245.1, 250, 251.1, 252.1, 240.1, 234.2, 230; 330/278, 285, 279, 296, 130, 127–131, 136, 51, 124 D

(56) References Cited

U.S. PATENT DOCUMENTS

| | | | | |
|---|---|---|---|---|
| 5,241,319 A | * | 8/1993 | Shimizu ....................... | 342/358 |
| 5,517,684 A | * | 5/1996 | Fujita et al. .............. | 455/234.2 |
| 5,889,821 A | * | 3/1999 | Arnstein et al. ............ | 375/285 |
| 6,208,203 B1 | * | 3/2001 | Jung et al. ...................... | 330/51 |
| 6,240,126 B1 | * | 5/2001 | Ohashi et al. ............... | 375/132 |
| 6,311,048 B1 | * | 10/2001 | Loke ........................ | 455/245.1 |
| 6,356,745 B1 | * | 3/2002 | Lee et al. ................. | 455/232.1 |
| 6,498,926 B1 | * | 12/2002 | Ciccarelli et al. ......... | 455/240.1 |
| 6,556,559 B1 | * | 4/2003 | Mitsume et al. ............. | 370/350 |

* cited by examiner

Primary Examiner—CongVan Tran
(74) Attorney, Agent, or Firm—Dilworth & Barrese LLP

(57) ABSTRACT

A low-noise amplifier for a mobile communication terminal maintains linearity with the least current consumption. A low-noise amplifier controller detects a signal-to-noise ratio (SNR) of a received signal, and outputs a control signal of a preset voltage when the SNR is lower than a predetermined SNR even though AGC AMP controller increases the AGC gain according to field strength. A bias circuit increases a bias current according to the control signal output from the low-noise amplifier controller. A low-noise amplifier amplifies the received signal to a preset level according to the bias current provided from the bias circuit.

7 Claims, 5 Drawing Sheets

LOW-NOISE AMPLIFIER FOR A MOBILE COMMUNICATION TERMINAL

PRIORITY

This application claims priority to an application entitled "Low-Noise Amplifier for a Mobile Communication Terminal" filed in the Korean Industrial Property Office on Dec. 29, 1999 and assigned Ser. No. 99-65239, the contents of which are hereby incorporated by reference.

BACKGROUND OF THE INVENTION

1. Field of the Invention

The present invention relates generally to a mobile communication terminal, and in particular, to a low-noise amplifier for amplifying a received signal in a mobile communication terminal.

2. Description of the Related Art

FIG. 1 is a block diagram illustrating a receiver for a conventional mobile communication terminal.

Referring to FIG. 1, upon receipt of a radio signal, an RSSI (Received Signal Strength Indicator) detector 310 detects field strength of the received signal and provides information on the detected field strength to an automatic gain control (AGC) amplifier controller 320. The AGC amplifier controller 320 compares the detected field strength information provided from the RSSI detector 310 with a predetermined field strength value. If the detected field strength is lower than or equal to the predetermined field strength, the AGC amplifier controller 320 provides a power-up command to an AGC amplifier 360 and a low-noise amplifier (LNA) controller 330 in order to increase a power level of the received signal.

The low-noise amplifier controller 330 then provides a first bias circuit 150 with a preset voltage in order to enable a low-noise amplifier 100. The first bias circuit 150 generates a bias voltage according to the preset voltage provided from the low-noise amplifier controller 330 and provides the generated bias voltage to a base of a bipolar junction transistor (BJT) 140. Then, the BJT 140 is turned ON in response to the bias voltage and a current flowing through the BJT 140 is amplified and matched through an input matching circuit 120 and an output matching circuit 130. The output of the output matching circuit 130 is provided to a down-converter 340. The down-converter 340 mixes a local oscillation frequency provided from a local oscillator 350 with the received signal amplified by the low-noise amplifier 100. AGC amplifier 360 amplifies the signal output from the down-converter 340 to a predetermined level and outputs the amplified signal in an intermediate frequency (IF).

As shown in FIG. 1, the receiver with the Si BJT has increased current consumption due to the turn-on voltage. In particular, when the Si BJT is used for the low-noise amplifier, the noise factor characteristic is degraded. Further, a gain of the Si BJT is significantly variable depending on the current and the Si BJT consumes a comparatively large current to maintain its linearity, as compared with an GaAs MESFET (Metal Semiconductor Field-Effect Transistor). Particularly, in a mobile communication system using a high frequency (e.g., at around 2 GHz) such as PCS (Personal Communication System) or IMT-2000 system, the receiver generally uses a 2-stage low-noise amplifier. When using a plurality of low-noise amplifiers, the receiver has greatly increased current consumption due to an increase in number of Si BJTs used.

FIG. 2 is a detailed circuit diagram illustrating a modified low-noise amplifier for the receiver in the conventional mobile communication terminal.

Referring to FIG. 2, a received signal is applied to the input matching circuit 120 and the signal matched by the input matching circuit 120 is applied to a gate of a MESFET 230, the gate being connected to a self-bias resistor 200. A source bias resistor 220 is set to a specific resistance to maintain linearity. A capacitor 260 connected to the source of the MESFET 230 and a capacitor 240 connected to the drain of the MESFET 230 are used as a bypass capacitor. A drain of the MESFET 230 is connected to the power supply voltage Vdd through an inductor 250. A signal at the drain of the MESFET 230 is matched by the output matching circuit 130. However, the receiver with the MESFET, generally, must provide a negative voltage to the gate of the MESFET as a bias voltage, and a separate negative voltage generator is therefore needed to provide the negative voltage. Therefore, as shown in FIG. 2, a positive voltage being provided to the source through the source bias resistor 220 on a self-bias basis is used as a gate bias voltage. However, when the gate voltage is controlled by using the source bias resistor 220, there is a limitation in controlling the current because the source bias resistor 220 has a fixed resistance.

SUMMARY OF THE INVENTION

It is, therefore, an object of the present invention to provide a low-noise amplifier with minimized current consumption.

It is another object of the present invention to provide a low-noise amplifier which can maintain linearity with the least current consumption.

To achieve the above and other objects, there is provided a low-noise amplifier for a mobile communication terminal. In the low-noise amplifier, a low-noise amplifier controller receives a signal-to-noise ratio (SNR) of a received signal, and outputs a control signal of a preset voltage when the SNR is lower than a predetermined SNR. A bias circuit increases a bias current according to the control signal output from the low-noise amplifier controller. A low-noise amplifier amplifies the received signal to a preset level according to the bias current provided from the bias circuit.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

A preferred embodiment of the present invention will be described herein below with reference to the accompanying drawings. In the following description, well-known functions or constructions are not described in detail since they would obscure the invention in unnecessary detail.

Figure 1:
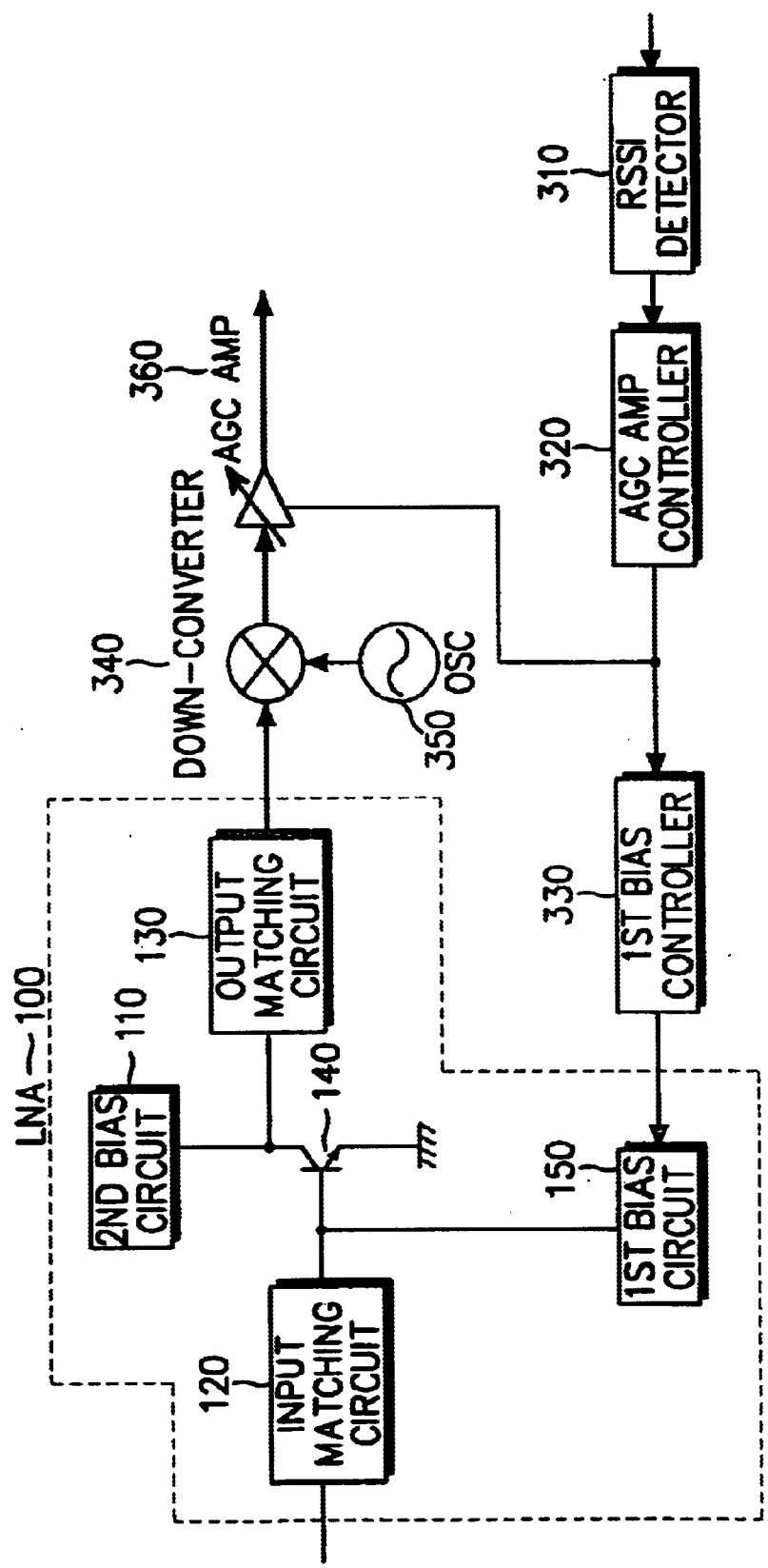
FIG. 1 is a block diagram illustrating a receiver for a conventional mobile communication terminal.
Figure 2:
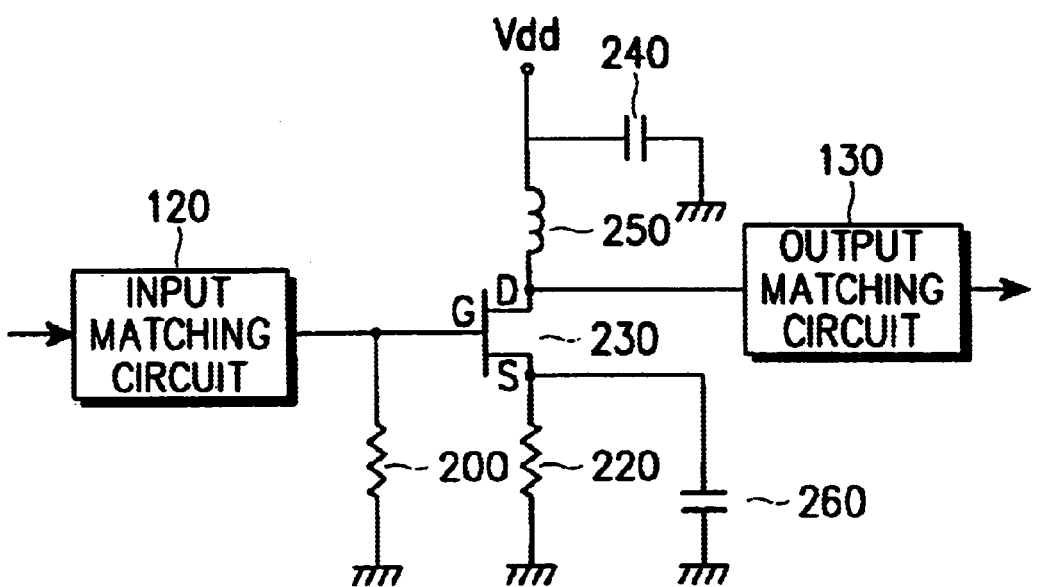
FIG. 2 is a detailed circuit diagram illustrating a modified low-noise amplifier for the receiver in a conventional mobile communication terminal.
Figure 3:
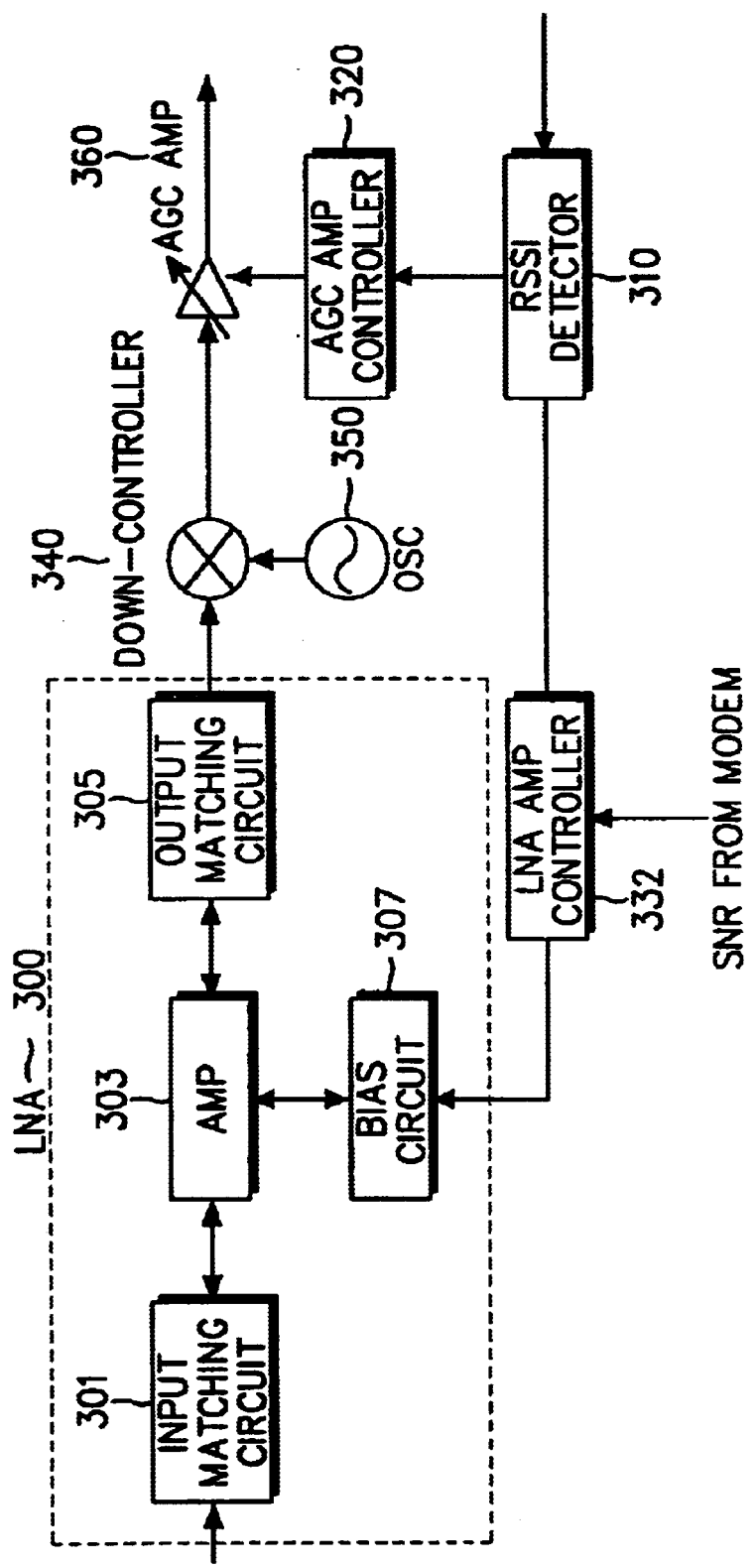
FIG. 3 is a block diagram illustrating a receiver for a mobile communication terminal according to an embodiment of the present invention.

FIG. 3 is a block diagram illustrating a receiver for a mobile communication terminal according to an embodiment of the present invention.

Referring to FIG. 3, upon receipt of a radio signal, an RSSI detector 310 detects field strength of the received signal and provides information on the detected field strength to an AGC amplifier controller 320 and a low-noise amplifier (LNA) controller 332. The AGC amplifier controller 320 compares the field strength information provided from the RSSI detector 310 with a predetermined field strength value. When the detected field strength is lower than the predetermined field strength, the AGC amplifier controller 320 provides a power-up command to an AGC amplifier 360 in order to increase a power level of the received signal. Otherwise, if the detected field strength of the received signal is higher than the predetermined field strength, the AGC amplifier controller 320 provides a power-down command to the AGC amplifier 360 in order to decrease the power level of the received signal. As a result, the level of the demodulated received signal will have a constant value regardless of the strength of the time-varying RF (Radio Frequency) signal. In addition, a required signal-to-noise ratio (SNR) is also maintained. The SNR is measured by a MODEM(not shown) and provided to the LNA controller 332.

In the CDMA system, part of the output power of the transmitter is detected at the receiver. Hence, when an interference wave higher in strength than a predetermined value exists in an adjacent channel, this interference wave and the RF signal of the receiver act as noises in the used channel due to intermodulation. Therefore, the SNR is decreased regardless of the automatic gain control (AGC), so that the demodulated received signal has errors, thus reducing a bit error rate (BER). This intermodulation problem can be solved by increasing input compressed power of the low-noise amplifier to increase linearity. Thus, linearity is improved through current control of the low-noise amplifier. However, if the noise level of the received signal increases due to intermodulation of the low-noise amplifier, the gain of the AGC amplifier 360 is increased, so that the SNR is not improved even though the field strength of the received signal is increased.

Therefore, in order to improve the SNR, the low-noise amplifier controller 332 provides a control signal to a bias circuit 307 to increase a current flowing into the MESFET, thereby improving linearity of the low-noise amplifier. The low-noise amplifier controller 332 compares the field strength information output from the RSSI detector 310. The low-noise amplifier controller 332 receives SNRs from MODEM and output a bias control signal when the SNR has no improvement even though the field strength is increasing. The low-noise amplifier controller 332 provides a control voltage to the bias circuit 307 in order to improve linearity of a low-noise amplifier 300. The bias circuit 307 generates a bias voltage according to the control voltage provided from the low-noise amplifier controller 332 and provides the generated bias voltage to an amplifier 303. The amplifier 303 is turned ON according to the bias voltage and a current flowing through amplifier(AMP) 303 is amplified and matched through the input matching circuit 301 and output matching circuit 305. A down-converter 340 mixes a local oscillation frequency provided from a local oscillator 350 with the received signal amplified by the low-noise amplifier 300. The AGC amplifier 360 amplifies the signal output from the down-converter 340 to a preset level and outputs the amplified signal in an intermediate frequency (IF).

Figure 4:
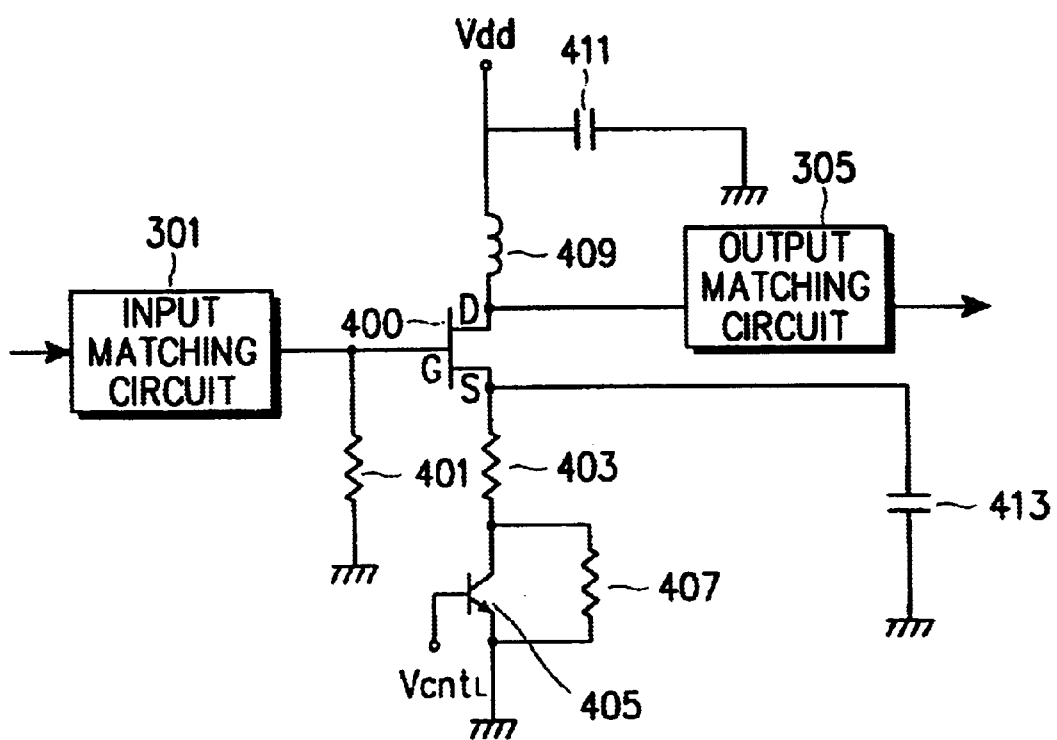
FIG. 4 is a detailed circuit diagram illustrating the low-noise amplifier, shown in FIG. 3, according to an embodiment of the present invention.

FIG. 4 is a detailed circuit diagram illustrating the low-noise amplifier of FIG. 3.

Referring to FIG. 4, a resistor 401 is a resistor which provides ground potential at a gate. A resistor 403 and a resistor 407, source self-bias resistors, are connected in series to a source of an MESFET 400 (AMP 303) to control a current flowing into a drain of the MESFET 400 by setting a negative gate voltage. A capacitor 411 and a capacitor 413 are used as a bypass capacitor. A drain of the MESFET 400 is connected to the power supply voltage Vdd through an inductor 409.

A control voltage Vcnt1 is provided to a base of a control transistor BJT 405 according to the field strength of the received signal and SNR which is measured at a MODEM (not shown). When the control transistor BJT 405 is turned ON by the control voltage Vcnt1, a specific resistance of the BJT 405 is decreased, so that a current flowing through the BJT 405 increases. The increase in current will improve the linearity of the low-noise amplifier.

Although the invention has been described with reference to an embodiment in which the BJT is used as an element for switching the resistors 403 and 407, it would be obvious to those skilled in the art that the BJT can be replaced with another switching element. For example, the BJT can be replaced with another switching element capable of switching the resistors 403 and 407, such as a zener diode, a MEMS (Micro-Electro Mechanical System) switch, and a MMIC (Monolithic Microwave Integrated Circuit) switch.

Figure 5:
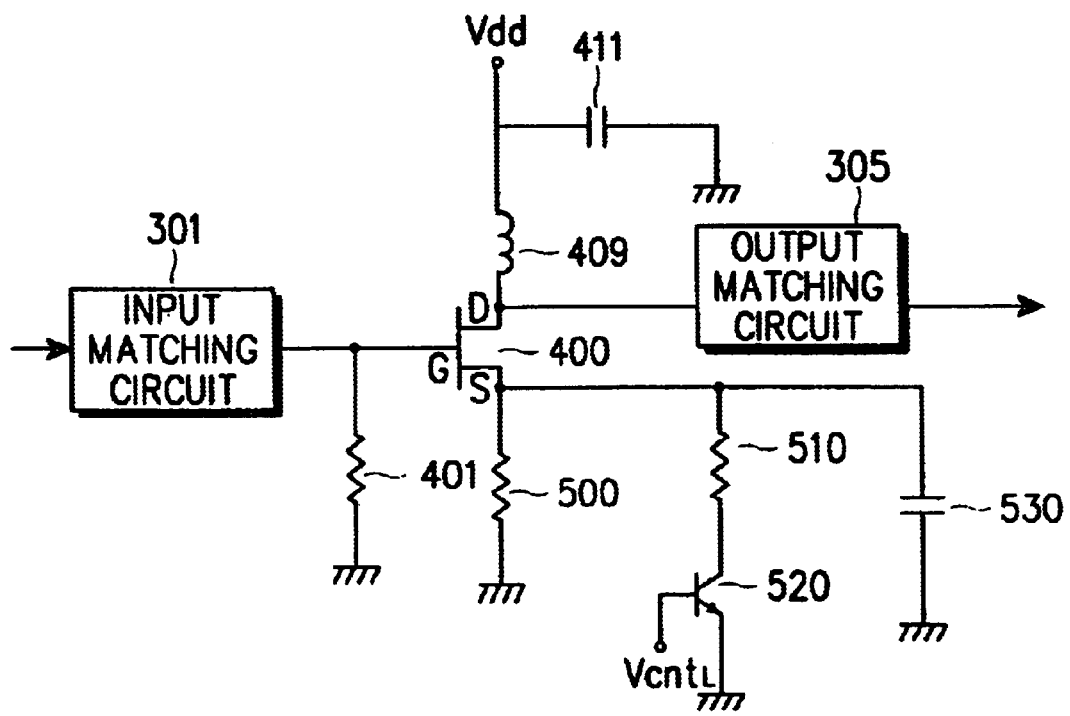
FIG. 5 is a detailed circuit diagram illustrating the low-noise amplifier, shown in FIG. 3, according to another embodiment of the present invention.

FIG. 5 is another detailed circuit diagram illustrating the low-noise amplifier of FIG. 3.

Referring to FIG. 5, a resistor 401 is a resistor which provides ground potential at a gate. A resistor 500 and a resistor 510, source self-bias resistors, are connected in parallel to a source of an MESFET 400 to control a current applied to a drain of the MESFET 400 by setting a negative gate voltage. A capacitor 411 and a capacitor 530 are used as a bypass capacitor. A drain of the MESFET 400 is connected to the power supply voltage Vdd through an inductor 409.

A control voltage Vcnt1 is provided to a base of a control transistor BJT 520 according to the field strength of the received signal and SNR measured at a MODEM(not shown). When the control transistor BJT 520 is turned ON by the control voltage Vcnt1, a specific resistance of the BJT 520 is decreased, so that a current flowing through the BJT 520 increases. The increase in current will improve the linearity of the low-noise amplifier.

Although the invention has been described with reference to an embodiment in which the BJT is used as an element for switching the resistors 500 and 510, it would be obvious to those skilled in the art that the BJT can be replaced with another switching element. For example, the BJT can be replaced with another switching element capable of switching the resistors 500 and 510, such as a zener diode, a MEMS switch, and a MMIC switch.

Table 1 below shows the simulation results of the low-noise amplifier, when the output end of the low-noise amplifier is current-controlled.

TABLE 1

| LNA Current (mA) | LNA Output Current (mA) | Noise Factor (dB) | Power Gain (dB) | Output Suppressed Power (dBm) | Input Compressed Power (dBm) |
|---|---|---|---|---|---|
| 9 | 4.5 | 1.08 | 17.5 | 4.5 | −12 |
| 13 | 8.5 | 1.07 | 18 | 8.5 | −8.5 |
| 14.5 | 10 | 1.07 | 18 | 9.5 | −7.5 |
| 18.5 | 14 | 1.07 | 18.5 | 11 | −5.5 |

As described above, the receiver for the mobile communication system according to the present invention maintains linearity, power gain and noise factor of the received signal by controlling the bias current in the low-noise amplifier. In addition, by controlling the bias current according to the field strength of the received signal and the SNR, it is possible to decrease current consumption of a battery provided to the receiver.

While the invention has been shown and described with reference to certain preferred embodiments thereof, it will be understood by those skilled in the art that various changes in form and detail may be made therein without departing from the spirit and scope of the invention as defined by the appended claims.

What is claimed is:

1. A receiver for a mobile communication terminal, comprising:

a low-noise amplifier controller for receiving a signal-to-noise ratio (SNR) of a received signal from a MODEM, receiving information about a received signal strength indicator (RSSI) from an RSSI detector, and outputting a control signal when the SNR has no improvement even though the RSSI is increasing; and a bias circuit comprising a switching element for increasing a bias current according to the control signal output from the low-noise amplifier controller and for setting a negative gate voltage on a semiconductor of a low noise amplifier, which amplifies the received signal to a corresponding signal level according to the bias current provided from the bias circuit.

2. The receiver as claimed in claim 1, wherein the low-noise amplifier comprises a metal semiconductor field-effect transistor (MESFET).

3. The receiver as claimed in claim 2, wherein the bias circuit comprises:

a bipolar junction transistor (BJT) receiving the control signal; and at least two resistors connected in parallel to a source of the MESFET to control a drain current.

4. The receiver as claimed in claim 2, wherein the bias circuit comprises:

a bipolar junction transistor (BJT) receiving the control signal; and at least two resistors connected in series to a source of the MESFET to control a drain current.

5. The receiver as claimed in claim 3, wherein, when the BJT is turned ON by the control signal, a specific resistance of the BJT decreases, thereby improving linearity of the low-noise amplifier.

6. The receiver as claimed in claim 4, wherein, when the BJT is turned ON by the control signal, a specific resistance of the BJT decreases, thereby improving linearity of the low-noise amplifier.

7. The receiver as claimed in claim 1, wherein the switching element can be one of a bipolar junction transistor (BJT), a zener diode, a MEMS switch or a MMIC switch.

* * * * *